United States Patent
Kan et al.

(10) Patent No.: US 7,457,337 B2
(45) Date of Patent: Nov. 25, 2008

(54) OPTICAL MODULE HAVING CASE GROUNDING USING BYPASS CAPACITOR

(75) Inventors: Jiaxi Kan, San Jose, CA (US); Yen-Ping Ho, San Jose, CA (US); Tianshu Wan, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 327 days.

(21) Appl. No.: 11/049,622

(22) Filed: Feb. 1, 2005

(65) Prior Publication Data

US 2006/0171431 A1  Aug. 3, 2006

(51) Int. Cl.
*H01S 3/00* (2006.01)
(52) U.S. Cl. ............... 372/38.1; 372/38.02; 372/38.07; 385/88; 385/89; 385/92; 385/93; 385/14; 398/118; 398/135; 257/678; 257/664
(58) Field of Classification Search .............. 371/38.02, 371/38.07, 38.03; 398/35, 138; 385/88, 385/92, 93
See application file for complete search history.

(56) References Cited

U.S. PATENT DOCUMENTS

| | | | |
|---|---|---|---|
| 6,206,582 B1* | 3/2001 | Gilliland | 385/92 |
| 6,728,276 B2* | 4/2004 | Shapiro et al. | 372/38.02 |
| 2002/0135845 A1* | 9/2002 | Robinson et al. | 359/189 |
| 2002/0141142 A1* | 10/2002 | Rookes | 361/538 |
| 2002/0181522 A1* | 12/2002 | Rookes et al. | 372/38.02 |
| 2003/0138008 A1* | 7/2003 | Riaziat et al. | 372/36 |
| 2005/0045374 A1* | 3/2005 | Kumar et al. | 174/254 |
| 2005/0175299 A1* | 8/2005 | Hargis et al. | 385/93 |
| 2005/0245103 A1* | 11/2005 | Ellison | 439/61 |
| 2006/0062526 A1* | 3/2006 | Ikeuchi | 385/88 |

OTHER PUBLICATIONS

IEEE Computer Society, IEEE Std 802.3ae™ -2002. IEEE Standard for Information Technology, Aug. 30, 2002, 529 pages.

* cited by examiner

*Primary Examiner*—Minsun Harvey
*Assistant Examiner*—Kinam Park
(74) *Attorney, Agent, or Firm*—Blakely, Sokoloff, Taylor & Zafman LLP

(57) ABSTRACT

According to embodiments of the present invention, an optical transponder includes a transmitter optical subassembly (TOSA). In one embodiment, the electrical ground of the TOSA may be DC-isolated from chassis ground of the transponder using a blocking capacitor that couples the AC signal path to VDD and that allows the case of the TOSA to float. In an alternative embodiment, the electrical ground of the TOSA may be DC-isolated from chassis ground of the transponder using a blocking capacitor that couples the AC signal path to VDD and a resistor that couples the DC bias level path to internal electrical ground or transponder case ground.

17 Claims, 5 Drawing Sheets

OPTICAL MODULE HAVING CASE GROUNDING USING BYPASS CAPACITOR

BACKGROUND

1. Field

Embodiments of the present invention relate to telecommunication equipment and, in particular, to optical transmitters.

2. Discussion of Related Art

Transponders may be used in telecommunication systems and/or networks to receive and transmit data and/or other information on optical and/or electrical signals. Traditional optical transponders have limitations, however.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF THE ILLUSTRATED EMBODIMENTS

Figure 1:
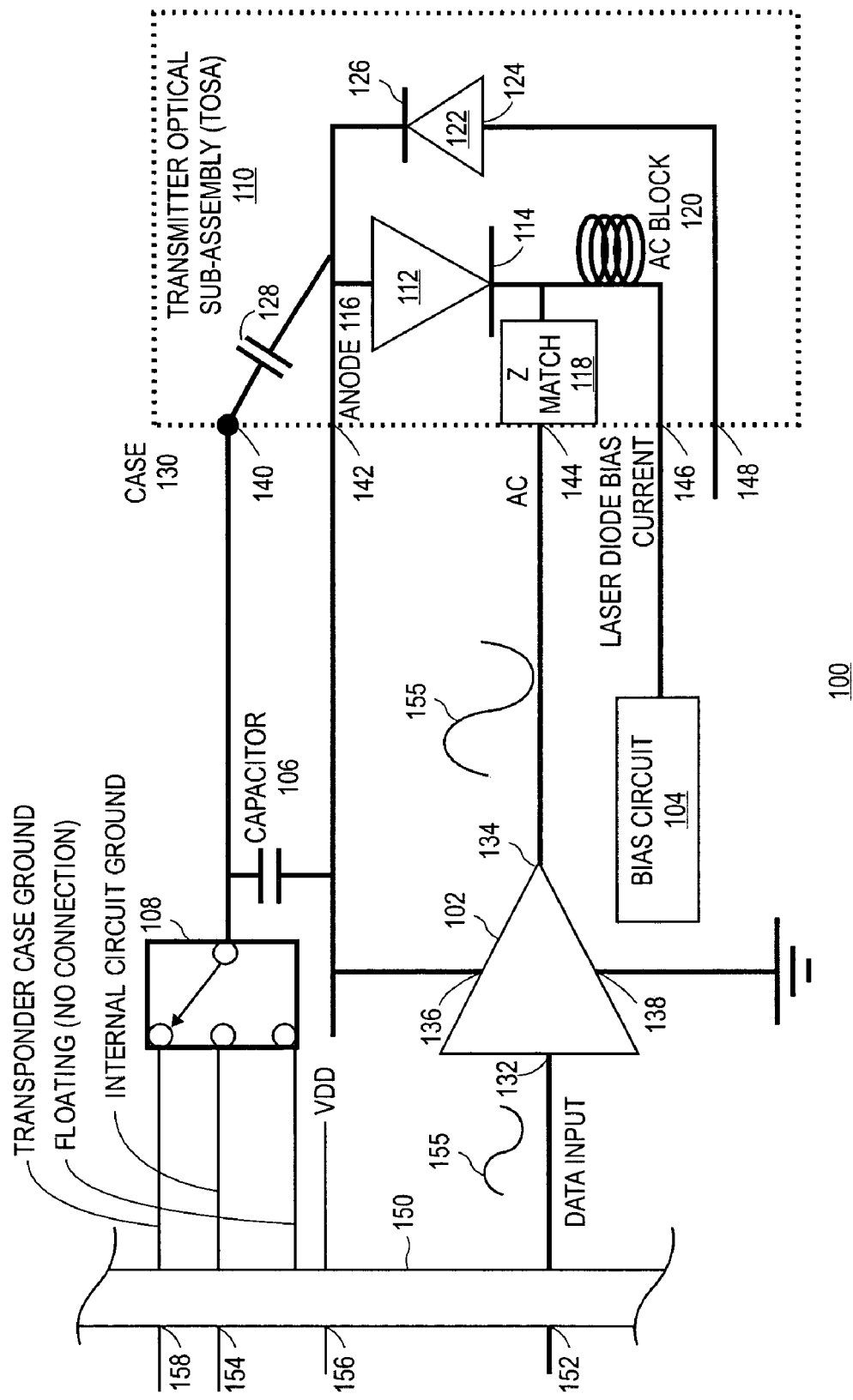
FIG. 1 is a schematic diagram of a transmitter according to an embodiment of the present invention.

FIG. 1 is a schematic diagram of a transmitter 100 according to an embodiment of the present invention. In the illustrated embodiment, the transmitter 100 includes a laser diode driver 102, a bias circuit 104, a blocking capacitor 106, and a 3×1 switch 108, each coupled to a transmitter optical subassembly (TOSA) 110.

In the illustrated embodiment, the TOSA 110 includes a laser diode 112 having a cathode 114 and an anode 116, an impedance matching circuit 118, an alternating current (AC) block circuit 120, a monitor photodiode 122 having an anode 124 and a cathode 126, an internal capacitor 128, and a case 130. In the illustrated embodiment, the driver 102 includes an input terminal 132, an output terminal 134, a power supply terminal 136, and an electrical ground terminal 138.

In the illustrated embodiment, the output terminal 134 is coupled to one terminal of the impedance matching circuit 118. The second terminal of the impedance matching circuit 118 is coupled to the cathode 114 of the laser diode 112 and to one terminal of the AC block circuit 120. The second terminal of the AC block circuit 120 is coupled to the bias circuit 104.

In the illustrated embodiment, the anode 116 of the laser diode 112 is coupled to the cathode 126 of the monitor photodiode 122, to one terminal of the internal capacitor 128, to one terminal of the blocking capacitor 106, to the power supply terminal 136 of the driver 102, and to the power supply VDD. The second terminal of the internal capacitor 128 is coupled to the case 130 of the TOSA 110, the second terminal of the blocking capacitor 106, and to one terminal of the switch 108. The second terminal of the switch 108 is coupled to electrical ground.

In embodiments of the present invention, the transmitter 100 may form part of optical transponder module (described with reference to FIG. 8 below), which may be compatible with the Institute of Electrical and Electronics Engineers (IEEE) 802.3ae standard, IEEE std. 802.3ae-2002, published Jul. _____, 2002. For example, the transmitter 100 may be compatible with the XFP family of devices, the XENPAK 10 Gigabit Ethernet multi-source agreement (MSA) family of devices, X2 family of devices, and/or X-Pak family of devices. Alternatively, the transmitter 100 may be 300-pin multi-source agreement (MSA) 10 Gigabit Ethernet (10 GbE) optical device.

In embodiments of the present invention, the driver 102 may be any suitable device capable of receiving and amplifying a data signal. In one embodiment, the driver 102 may provide sufficient current to modulate the laser diode 112.

In embodiments of the present invention, the bias circuit 104 may be any suitable circuit capable of providing a current to bias the laser diode 112. In one embodiment, the bias circuit 104 may provide current to control the direct current (DC) bias level of the laser diode 112.

In embodiments of the present invention, the blocking capacitor 106 may be any suitable capacitor capable of coupling the AC return path of a data signal applied to the driver 102 to the power supply VDD.

In embodiments of the present invention, the switch 108 may be any suitable switch capable of coupling the DC level to transponder case ground, electrical circuit ground, and/or capable of allowing the case 130 of TOSA 110 to float. In one embodiment, the switch 108 provides a zero ohm resistance.

In embodiments of the present invention, the TOSA 110 may be packaged in a top open can ("TO-Can") package. The top open can may include four or five pins, for example, and a header or lid. In the illustrated embodiment, the TOSA 110 includes five pins, such as for example, a pin 140 coupled to the TOSA can 130, a pin 142 coupled to the anode 116 of the laser diode 112, a pin 144 coupled to the output terminal 134 of the driver 102, and to the impedance matching circuit 118, a pin 146 coupled to the bias circuit 104 and the AC block circuit 120, and a pin 148 coupled to the anode 124 of the monitor photodiode 122.

Although not illustrated, the TOSA 110 may include one or more lenses, optical isolators, and/or optical fiber stubs.

In embodiments of the present invention, the laser diode 112 may be any suitable device capable of receiving a data stream on an electrical signal and converting the electrical signal to an optical signal. In one embodiment, the laser diode 112 may be an edge-emitter, such as a distributed feedback (DFB) laser or a Fabry-Perot (FP) laser. The laser diode may be a vertical cavity surface emitting laser (VCSEL). In embodiments of the present invention, the laser diode 112 may be a multimode laser or a single mode laser.

In embodiments of the present invention, the impedance matching circuit 118 may be any suitable circuit capable of matching the impedance of the driver 102 to the impedance of the TOSA 110.

In embodiments of the present invention, the AC block 120 may be any suitable circuit capable of isolating an AC signal from the bias circuit 104.

In embodiments of the present invention, the monitor photodiode 122 may be any suitable photodiode capable of monitoring the power of the laser diode 112.

In embodiments of the present invention, the internal capacitor 128 may be any suitable capacitor capable of coupling the anode 116 of the laser diode 112 to the case 130 of the TOSA 110.

In the illustrated embodiment, a connector 150 includes a pin 152, which is coupled to the input terminal 132 of the driver 102, to receive an AC data signal 155, a pin 154 coupled to electrical ground, a pin 156 coupled to the power supply VDD, and a pin 158 coupled to the transponder case ground. In one embodiment, the connector 150 may be compliant with the 300-pin, XFP, XENPAK, or other suitable MSA.

Figure 2:
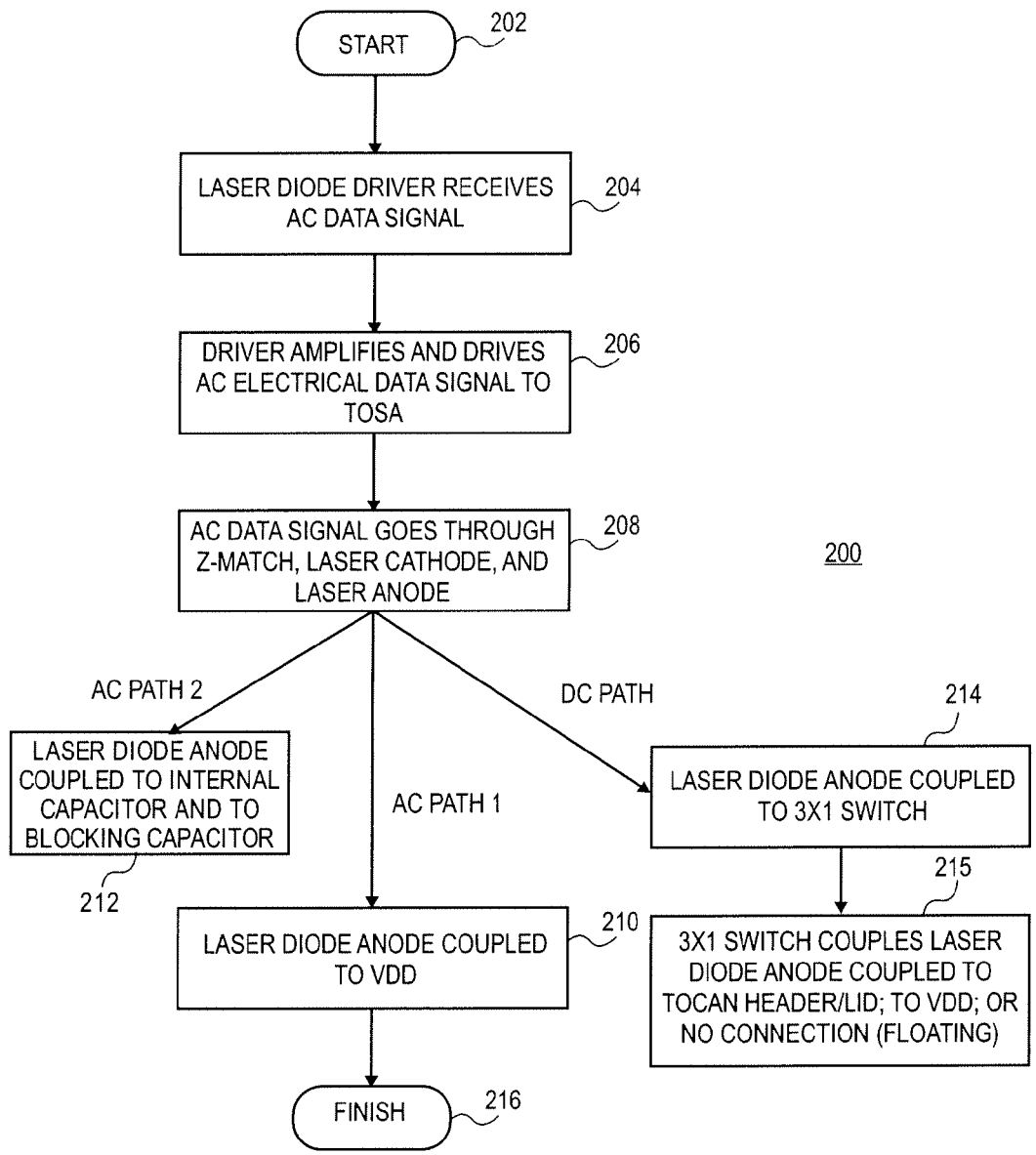
FIG. 2 is a flow chart illustrating an approach to operating a transmitter according to an embodiment of the present invention.

FIG. 2 is a flow chart illustrating a method 200 for operating the transmitter 100 according to an embodiment of the present invention. The method 200 begins with a block 202, where control passes to a block 204.

In the block 204, the data signal 155 may be received on the pin 152 and coupled to the input terminal 132 of the driver 102 via transmission line implemented in micro-strip technology. In one embodiment, the data signal may be approximately 10 Gbps. In other embodiments, the data signal may have any suitable data rate. In one embodiment, the bias circuit 104 may apply a bias current to the laser diode 112 to set the DC bias level for the laser diode 112.

In a block 206, the driver 102 may amplify the data signal 155 and drive the data signal 155 onto the pin 144 of the TOSA 110 via transmission line implemented in micro-strip technology. In one embodiment, the impedance matching circuit 118 may match the impedance of the driver 102 to TOSA 110.

In a block 208, the AC signal may pass through the impedance matching circuit 118, the laser diode 112 cathode 114, and the laser diode 112 anode 116 may convert the data signal 155 into an optical signal, which the monitor photodiode 122 may monitor for optical power.

In a block 210, the internal capacitor 128 may couple the AC signal passing through the laser diode 112 to VDD.

In a block 212, the anode 116 may be coupled to the internal capacitor 128 and to the blocking capacitor 106, which may couple the AC signal from the case 130 of the TOSA 110 to the power supply voltage VDD via transmission line implemented in micro-strip technology and may block the DC bias level from the anode 116 of the laser diode 112. In one embodiment, the DC potential on the case 130 of the TOSA 110 may float and the anode 116 of the laser diode 112 may be at the power supply voltage VDD. In this embodiment, electrical ground for the TOSA 110 may be DC-isolated from the chassis ground of the transmitter 100.

In a block 214, the anode 116 may be coupled to the switch 108.

In a block 215, the switch 108 may couple the DC bias level to the transponder case ground, to internal electrical ground, or may leave it floating (no connection), via transmission line implemented in micro-strip technology. In this embodiment, the DC potential on the case 130 of the TOSA 110 may be at transponder case ground, internal electrical ground potential, or just floating without a connection, the anode 116 of the laser diode 112 may be at the power supply voltage VDD, and electrical ground for the TOSA 110 may be DC-isolated from the chassis ground of the transmitter 100.

In a block 216, the method 200 finishes.

The operations of the method 200 have been described as multiple discrete blocks performed in turn in a manner that may be most helpful in understanding embodiments of the invention. However, the order in which they are described should not be construed to imply that these operations are necessarily order dependent or that the operations be performed in the order in which the blocks are presented. Of course, the method 200 is an example process and other processes may be used to implement embodiments of the present invention. a machine-accessible medium with machine-readable data thereon may be used to cause a machine, such as, for example, a processor (not shown) to perform the method 200.

Figure 3:
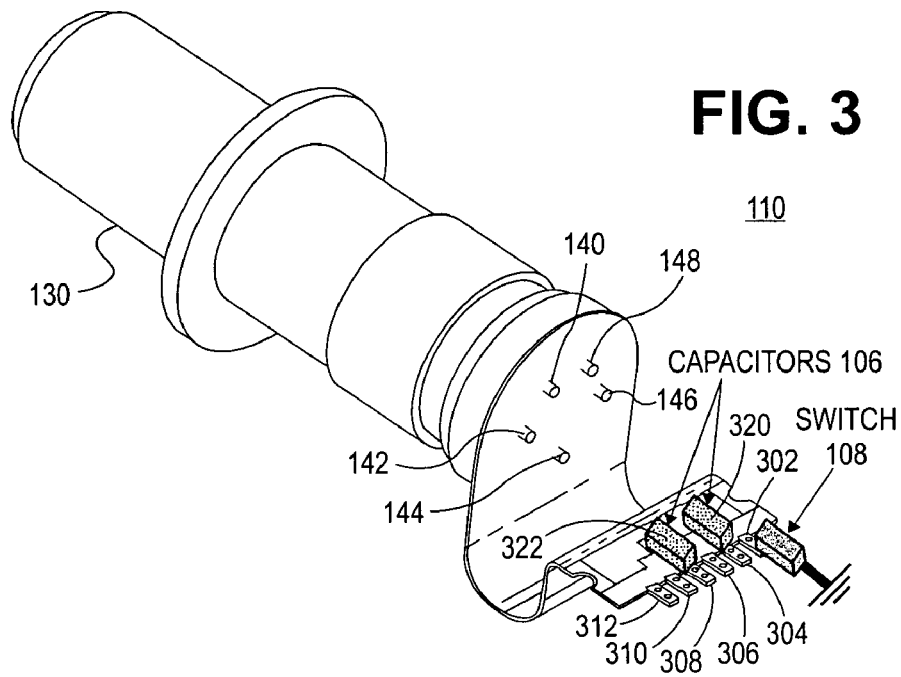
FIG. 3 is a perspective diagram of a top open transmitter optical subassembly (TOSA) according to an embodiment of the present invention.

FIG. 3 is a perspective diagram of the TOSA 110 according to an embodiment of the present invention. In the illustrated embodiment, the TOSA 110 includes the case 130, the pin 140, which is coupled to the TOSA case 130, the pin 142, which is coupled to the anode 116 of the laser diode 112, the pin 144, which is coupled to the data signal input of the TOSA 110, the 146, which is coupled to laser diode 112 bias circuit 104, and the pin 148, which is coupled to the monitor photodiode 122 anode 124. The example TOSA 110 also includes a flexible circuit board 300, which includes a pin 302, which is coupled to the TOSA pin 140, a pin 304, which is coupled to the TOSA pin 142, a pin 306, which is coupled to the TOSA pin 144, a pin 308, which is coupled to the TOSA pin 142, a pin 310, which is coupled to the TOSA pin 146, and a pin 312, which is coupled to the TOSA pin 148.

In the illustrated embodiment, the switch 108 is coupled to the pin 302, which is coupled to the case 130 of the TOSA 110, and to the transponder case ground, internal electrical ground, or is floating.

In the illustrated embodiment, the blocking capacitor 106 is implemented using two separate capacitors 320 and 322. In this embodiment, the AC signal path length may be substantially equivalent to the DC path length. In the illustrated embodiment, the blocking capacitor 320 is coupled to the anode 116 of the laser diode 112 via the pin 304 and the blocking capacitor 322 is coupled to the anode 116 of the laser diode 112 via the pin 308. In one embodiment, the capacitor 320 may be 0.1 µf and the capacitor 322 may be 0.1 µf.

Figure 4:
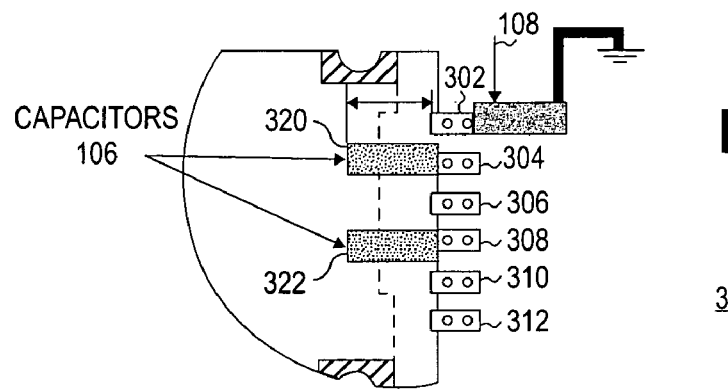
FIG. 4 is a top view of a flexible circuit board pin-out for a top open transmitter optical subassembly (TOSA) according to an embodiment of the present invention.

FIG. 4 is a top view of the flexible circuit board 300 pin-out for the TOSA 110 according to an embodiment of the present invention. The illustrated embodiment shows the flexible circuit board 300 with the pins 302, 304, 306, 308, 310, and 312, the capacitors 320 and 322, the switch 108, and electrical ground.

Figure 5:
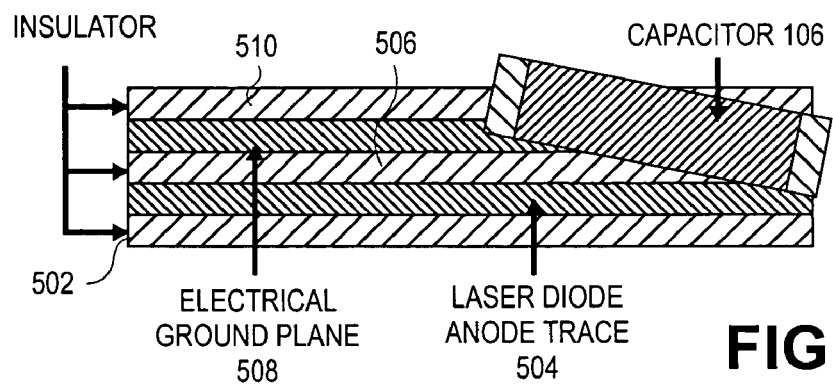
FIG. 5 is a cross-section view of a flexible circuit board for a top open transmitter optical subassembly (TOSA) according to an embodiment of the present invention.

FIG. 5 is a cross-section view of the flexible circuit board 300 according to an embodiment of the present invention. In the illustrated embodiment, the flexible circuit board 300 includes a layer 502 of insulating material, a layer 504 of metal disposed on the layer 502, a layer 506 of insulating material disposed on the layer 504, a layer 508 of metal disposed on the layer 506, and a layer 510 of insulating material disposed on the layer 508. In one embodiment, the layer 504 may be a metal trace coupled to the anode 116 of the laser diode 112 and the layer 508 may be the ground plane for electrical ground.

In the illustrated embodiment, one end of the capacitor 106 is coupled to the anode 116 of the laser diode 112 via the layer 504 and the other end of the capacitor 106 is coupled to electrical ground via the layer 508. In one embodiment, the layers 502, 506, and 510 may be any suitable insulating material, such as polyimide or other suitable dielectric material.

Figure 6:
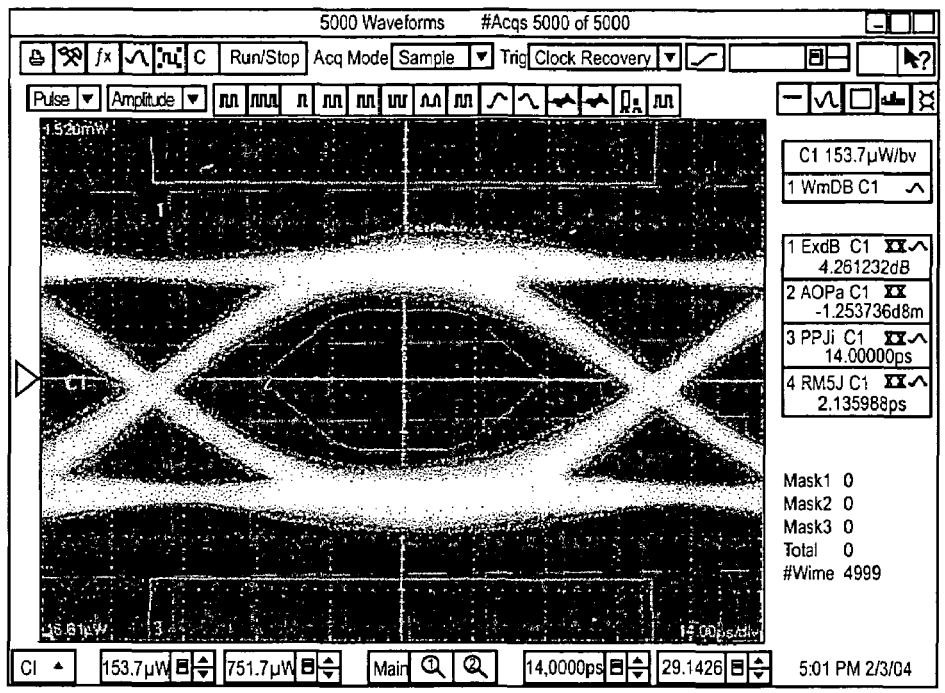
FIG. 6 is a graphical representation (or eye diagram) representing an optical signal according to an embodiment of the present invention.

FIG. 6 is a graphical representation (or eye diagram) 600 representing an optical signal generated by the laser diode 112 according to an embodiment of the present invention. In one embodiment, the eye diagram 600 may comprise the data bits acquired from the data signal 155 overlaid on top of each other.

In the example embodiment, the blocking capacitor 108 may be blocking the DC bias level and coupling the AC signal to VDD. In this embodiment, the case 130 of the TOSA 110 is floating at approximately VDD and the AC return path is through VDD. In this embodiment, the mask margin may be fifteen percent.

Figure 7:
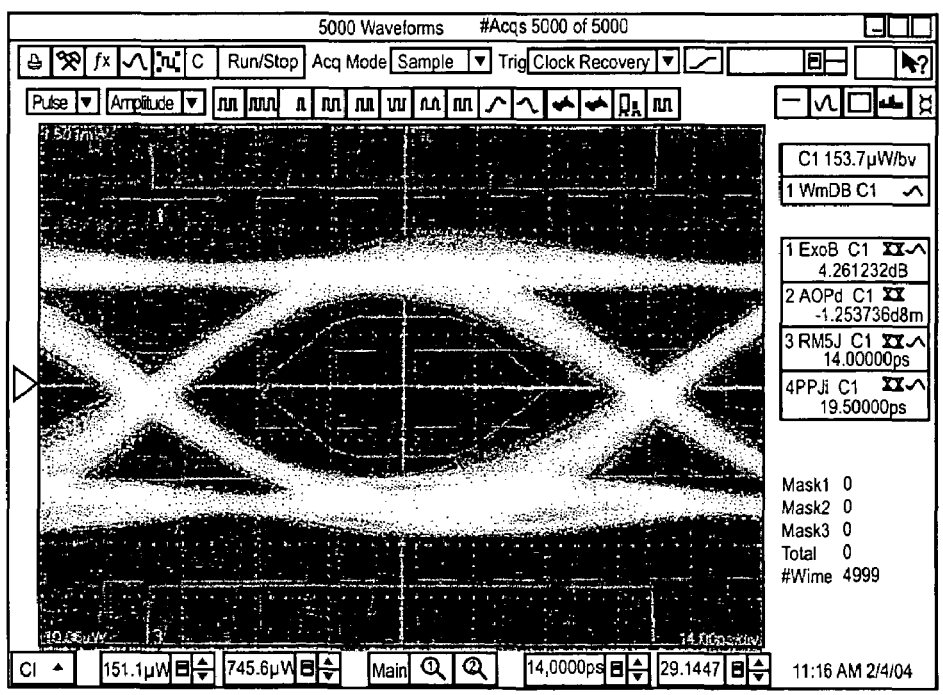
FIG. 7 is a graphical representation (or eye diagram) representing an optical signal according to an alternative embodiment of the present invention.

FIG. 7 is a graphical representation (or eye diagram) 700 representing an optical signal generated by the laser diode 112 according to an alternative embodiment of the present invention. In the example embodiment, the blocking capacitor 106 may be blocking the DC bias level and coupling the AC signal to VDD. The switch 108 may be coupling the DC bias level to the transponder case ground, internal electrical ground, or floating. In this embodiment, the case 130 of the TOSA 110 is at electrical ground potential and the AC return path is through VDD. In this embodiment, the mask margin may be sixteen percent.

Figure 8:
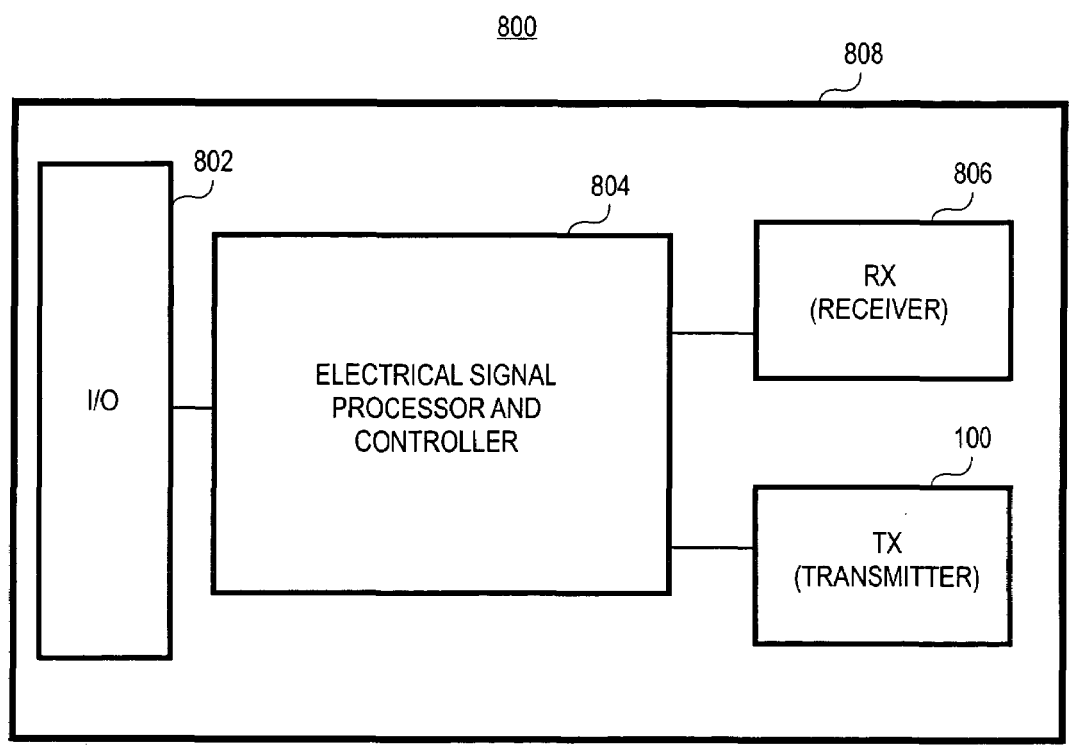
FIG. 8 is a high-level block diagram of a transponder according to embodiments of the present invention.

FIG. 8 is a high-level block diagram of a transponder 800 according to embodiments of the present invention. In the illustrated embodiment, the transponder 800 includes an input/output (I/O) block 802 coupled to an electrical signal processor and controller block 804. The block 804 is coupled to the transmitter 100, which converts an electrical signal to an optical signal, and a receiver 806, which converts an optical signal to an electrical signal.

In the illustrated embodiment, the transponder 800 includes a case 808.

Embodiments of the present invention may be implemented using hardware, software, or a combination thereof. In implementations using software, the software may be stored on a machine-accessible medium.

a machine-accessible medium includes any mechanism that may be adapted to store and/or transmit information in a form accessible by a machine (e.g., a computer, network device, personal digital assistant, manufacturing tool, any device with a set of one or more processors, etc.). For example, a machine-accessible medium includes recordable and non-recordable media (e.g., read only memory (ROM), random access memory (RAM), magnetic disk storage media, optical storage media, flash memory devices, etc.), such as electrical, optical, acoustic, or other form of propagated signals (e.g., carrier waves, infrared signals, digital signals, etc.).

In the above description, numerous specific details, such as, for example, particular processes, materials, devices, and so forth, are presented to provide a thorough understanding of embodiments of the invention. One skilled in the relevant art will recognize, however, that the embodiments of the present invention may be practiced without one or more of the specific details, or with other methods, components, etc. In other instances, structures or operations are not shown or described in detail to avoid obscuring the understanding of this description.

Reference throughout this specification to "one embodiment" or "an embodiment" means that a particular feature, structure, process, block, or characteristic described in connection with an embodiment is included in at least one embodiment of the present invention. Thus, the appearance of the phrases "in one embodiment" or "in an embodiment" in various places throughout this specification does not necessarily mean that the phrases all refer to the same embodiment. The particular features, structures, or characteristics may be combined in any suitable manner in one or more embodiments.

The terms used in the following claims should not be construed to limit embodiments of the invention to the specific embodiments disclosed in the specification and the claims. Rather, the scope of embodiments of the invention is to be determined entirely by the following claims, which are to be construed in accordance with established doctrines of claim interpretation.

What is claimed is:

1. An apparatus, comprising:
   a top open transmitter optical subassembly (TOSA), the TOSA having:
   a laser diode having an anode and a cathode;
   a first capacitance having a first terminal coupled to the laser diode anode and a second terminal coupled to a case of the TOSA;
   a power supply coupled to the laser diode anode and to the first terminal of the first capacitance;
   a second capacitance having a first terminal coupled to the TOSA case and the second terminal of the first capacitance, the second capacitance having further a second terminal coupled to the power supply, to the laser diode anode, and to the first terminal of the first capacitance; and
   a switch having an input terminal coupled to the first terminal of the second capacitance, to the TOSA case ground, and to the second terminal of the first capacitance, the switch having further a first output terminal coupled to a TOSA case ground, a second output terminal coupled to an electrical ground for the apparatus, and a third floating output terminal.

2. The apparatus of claim 1, further comprising a direct current (DC) bias circuit coupled to the laser diode anode.

3. The apparatus of claim 2, further comprising:
   a driver having a first terminal coupled to the laser diode cathode to drive a data signal to the laser diode;
   an impedance matching circuit having a first terminal coupled to the first terminal of the driver and a second terminal coupled to the laser diode cathode; and
   an inductance having a first terminal coupled to the second terminal of the impedance matching circuit and the laser diode cathode, the inductance having a second terminal coupled to the DC bias circuit.

4. The apparatus of claim 3, wherein the TOSA further comprises:
   a first TOSA pin coupled to the TOSA case;
   a second TOSA pin coupled to the laser diode anode;
   a third TOSA pin coupled to an input of the driver;
   a fourth TOSA pin coupled to the laser diode cathode;
   a fifth TOSA pin coupled to the bias circuit; and
   a sixth TOSA pin coupled to a monitor photodiode anode, the monitor photodiode having a cathode coupled to the laser diode anode and to the first terminal of the first capacitance.

5. The apparatus of claim 4, further comprising a flexible circuit board mounted to the TOSA, the flexible circuit board having:
   a first flexible circuit board pin coupled to the first terminal on the switch, and to the first TOSA pin;
   a second flexible circuit board pin coupled to the second TOSA pin;

a third flexible circuit board pin coupled to the third TOSA pin;

a fourth flexible circuit board pin coupled to the fourth TOSA pin;

a fifth flexible circuit board pin coupled to the fifth TOSA pin; and a sixth flexible circuit board pin coupled to the sixth TOSA pin.

6. The apparatus of claim 5, wherein the flexible circuit board comprises:

a first layer of insulating material, wherein the first metal layer is coupled to the second flexible circuit board pin, the fourth flexible circuit board pin, and the fifth flexible circuit board pin;

a first metal layer disposed on the first layer of insulating material;

a second insulating material layer disposed on the first metal layer;

a second metal layer disposed on the second layer of insulating material, wherein the second metal layer is coupled to the first flexible circuit board pin; and a third layer of insulating material disposed on the second metal layer 7. An apparatus, comprising:

receiving a data signal at a top open transmitter optical subassembly (TOSA), the data signal having an alternating current (AC) signal and a direct current (DC) level, the TOSA having a laser diode having an anode and a cathode, a first capacitance having a first terminal coupled to the laser diode anode and a second terminal coupled to a case of the TOSA;

coupling a first portion of the AC signal through the laser diode to a power supply;

coupling second portion of the AC signal through the laser diode, the first capacitance, the second capacitance, and the power supply, the second capacitance having a first terminal coupled to the TOSA case and the second of the first capacitance, the second capacitance having further a second terminal coupled to the power supply, to the laser diode anode, and to the first terminal of the capacitance; and coupling the DC level through the laser diode, the first capacitance, and to a switch, the switch having an input terminal coupled to the first terminal of the second capacitance, to the TOSA case ground, and to the second terminal of the first transistor, the switch having further a first output terminal coupled to a TOSA case ground, a second output terminal coupled to a electrical ground for the apparatus, and a third floating output terminal.

8. The method of claim 7, further comprising:
coupling the DC level through the laser diode to the TOSA case; and
returning the DC level from the TOSA case to electrical ground via a switch.

9. The method of claim 7, further comprising:
coupling the DC level through the laser diode to the TOSA case; and
allowing a potential on the TOSA case to float.

10. The method of claim 7, further comprising matching an impedance of the driver to an impedance of the laser diode.

11. The method of claim 10, further comprising biasing the laser diode to control the DC level using a bias circuit.

12. The method of claim 11, further comprising isolating the AC signal from the bias circuit.

13. The method of claim 12, further comprising monitoring an optical power of the laser diode.

14. A system, comprising:

a top open transmitter optical subassembly (TOSA), the TOSA having:

a laser diode having an anode and a cathode;

a first capacitance having a first terminal coupled to the laser diode anode and a second terminal coupled to a case of the TOSA;

a power supply coupled to the laser diode anode and to the first terminal of the first capacitance;

a second capacitance having a first terminal coupled to the TOSA case and the second terminal of the first capacitance, the second capacitance having further a second terminal coupled to the power supply, to the laser diode anode, and to the first terminal of the first capacitance; and a switch having an input terminal coupled to the first of the second capacitance, to the TOSA case ground, and to the second terminal of the first transistor, the switch having further a first output terminal coupled to a TOSA case ground, a second output terminal coupled to an electrical ground for the apparatus, and a third floating output terminal; and a XENPAK connector coupled to the optical transponder, the XENPAK connector to receive a data signal, the data to be converted to an optical signal by the optical transponders.

15. The system of claim 14, wherein the XENPAK connector includes at least one pin to receive a bias signal for the laser diode.

16. The system of claim 15, wherein the XENPAK connector includes at least one pin to receive the power supply.

17. The system of claim 14, wherein the XENPAK connector includes at least one pin to coupled to circuit ground.

* * * * *